United States Patent
Han et al.

(10) Patent No.: US 9,983,229 B2
(45) Date of Patent: May 29, 2018

(54) TEST SOCKET FOR TESTING SEMICONDUCTOR CHIP PACKAGE AND METHOD OF MANUFACTURING THE SAME

(71) Applicant: Samsung Electronics Co., Ltd., Suwon-si (KR)

(72) Inventors: Jong-won Han, Cheonan-si (KR); Jong-woo Lee, Seoul (KR); Young-gi Min, Asan-si (KR); Soon-won Lee, Suwon-si (KR); Yong-in Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 372 days.

(21) Appl. No.: 14/743,163

(22) Filed: Jun. 18, 2015

(65) Prior Publication Data
US 2016/0109480 A1    Apr. 21, 2016

(30) Foreign Application Priority Data
Oct. 21, 2014 (KR) .................. 10-2014-0142778

(51) Int. Cl.
*G01R 31/00* (2006.01)
*G01R 1/04* (2006.01)
(Continued)

(52) U.S. Cl.
CPC ........... *G01R 1/0433* (2013.01); *G01R 31/26* (2013.01); *H01B 1/02* (2013.01); *H01B 1/04* (2013.01);
(Continued)

(58) Field of Classification Search
CPC .. G01R 1/466; G01R 1/7314; G01R 31/2879; G01R 31/2886; G01R 31/2889; G01R 31/2896
See application file for complete search history.

(56) References Cited

U.S. PATENT DOCUMENTS 5,329,227 A * 7/1994 Sinclair ............... G01R 1/0433
324/756.02
6,518,091 B1 2/2003 Haba
(Continued)

FOREIGN PATENT DOCUMENTS

KR          100929645       12/2009
KR     20110061998 A *  6/2011
(Continued)

OTHER PUBLICATIONS

English Translation for KR20110061998A.*

*Primary Examiner* — Tung X Nguyen
*Assistant Examiner* — Dominic Hawkins
(74) *Attorney, Agent, or Firm* — Onello & Mello, LLP

(57) ABSTRACT

A test socket is provided that includes a base material including an insulating elastic material and a conductive portion extending through the base material in a thickness direction of the base material, wherein the conductive portion includes a plurality of conductive particle structures arranged in the thickness direction of the base material, and each of the plurality of conductive particle structures includes a plurality of conductive particles having at least one insulating wire and/or at least one conductive wire extending from a surface of the conductive particle, bonded with a material having a functional group.

19 Claims, 18 Drawing Sheets

(51) Int. Cl.
  *H01R 24/20*  (2011.01)
  *H01B 1/02*  (2006.01)
  *H01B 1/04*  (2006.01)
  *H01R 13/03*  (2006.01)
  *G01R 31/26*  (2014.01)
  *H01R 13/24*  (2006.01)
  *H01R 107/00*  (2006.01)

(52) U.S. Cl.
  CPC ......... *H01R 13/03* (2013.01); *H01R 13/2414* (2013.01); *H01R 24/20* (2013.01); *H01R 2107/00* (2013.01); *H01R 2201/20* (2013.01)

(56) References Cited

U.S. PATENT DOCUMENTS

| | | | |
|---|---|---|---|
| 6,545,363 B2* | 4/2003 | Maruyama | G01R 1/06711 257/773 |
| 6,641,898 B2* | 11/2003 | Yazaki | H05K 3/4069 174/257 |
| 6,812,718 B1* | 11/2004 | Chong | G01R 1/07342 324/754.07 |
| 6,891,386 B2 | 5/2005 | Matsuzawa | |
| 7,267,559 B2* | 9/2007 | Hashitani | G01R 1/06755 439/91 |
| 7,622,375 B2 | 11/2009 | Kisu et al. | |
| 7,718,995 B2 | 5/2010 | Kawashima et al. | |
| 7,968,462 B1 | 6/2011 | Sun et al. | |
| 8,102,005 B2 | 1/2012 | Yamamoto et al. | |
| 8,158,503 B2 | 4/2012 | Abe | |
| 8,723,049 B2* | 5/2014 | Woychik | H01L 21/76898 174/261 |
| 2001/0016435 A1* | 8/2001 | Fujimura | G01R 1/0483 439/66 |
| 2003/0141883 A1* | 7/2003 | Mitchell | G01R 1/07314 324/756.03 |
| 2006/0263581 A1* | 11/2006 | Park | H01B 1/22 428/212 |
| 2007/0020771 A1 | 1/2007 | Dutta et al. | |
| 2007/0054984 A1* | 3/2007 | Jun | H05K 3/323 523/204 |
| 2008/0048324 A1* | 2/2008 | Hong | C08L 79/02 257/741 |
| 2011/0032063 A1* | 2/2011 | Dang | G01R 31/2889 336/192 |
| 2011/0269015 A1* | 11/2011 | Cho | H01M 4/131 429/213 |
| 2012/0298929 A1* | 11/2012 | Mizumura | H01B 1/22 252/513 |
| 2013/0285692 A1* | 10/2013 | Lee | G01R 1/0408 324/756.02 |
| 2013/0292160 A1 | 11/2013 | Yang et al. | |
| 2014/0000713 A1 | 1/2014 | Kohen et al. | |
| 2014/0253827 A1* | 9/2014 | Gao | H05K 1/0298 349/12 |
| 2015/0153387 A1* | 6/2015 | Lee | G01R 1/0466 324/756.02 |

FOREIGN PATENT DOCUMENTS

| | | |
|---|---|---|
| KR | 101246301 | 3/2013 |
| KR | 101353481 | 1/2014 |
| KR | 101378505 | 3/2014 |

* cited by examiner

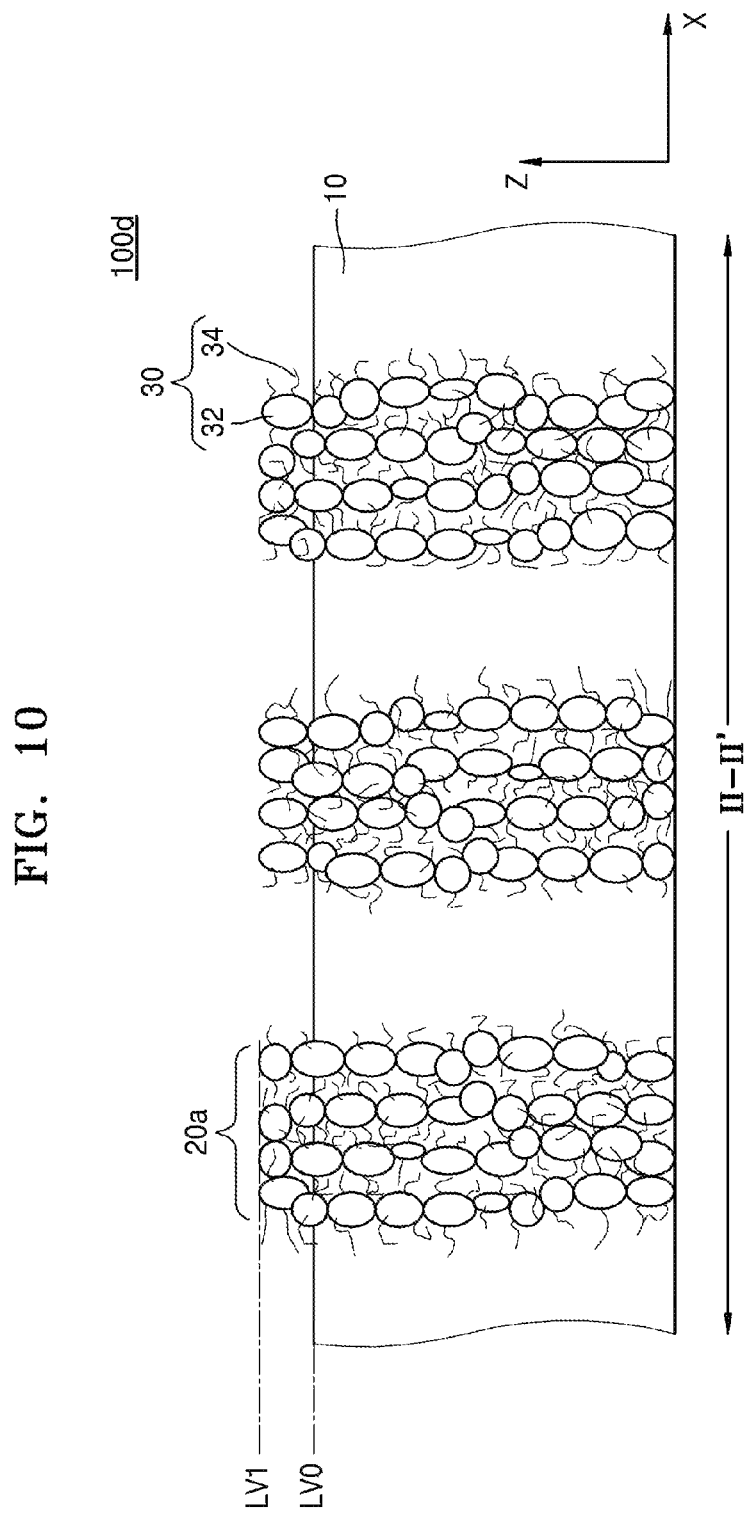

TEST SOCKET FOR TESTING SEMICONDUCTOR CHIP PACKAGE AND METHOD OF MANUFACTURING THE SAME

CROSS-REFERENCE TO RELATED APPLICATIONS

This application claims the benefit of Korean Patent Application No. 10-2014-0142778, filed on Oct. 21, 2014, in the Korean Intellectual Property Office, the disclosure of which is incorporated herein in its entirety by reference.

BACKGROUND

The inventive concept relates to a test socket for testing a semiconductor chip package, and more particularly, to a test socket for testing a semiconductor chip package having conduction anisotropy and to a method of manufacturing the test socket.

To test a semiconductor chip package, a method that has been used includes providing an electrical connection between the semiconductor chip package and a test device by using a test socket that has an array of metal particles arranged in a direction in an insulating matrix that has elasticity. However, the metal particles may become separated or detached from the insulating matrix due to repeated uses of the test socket.

SUMMARY

According to an aspect of the inventive concept, there is provided a test socket including: a base material including an insulating elastic material; and a conductive portion extending in a thickness direction of the base material in the base material. The conductive portion may include a plurality of conductive particle structures arranged in the thickness direction of the base material, and each of the plurality of conductive particle structures includes a conductive particle and at least one insulating wire extending from a surface of the conductive particle.

An end of the at least one insulating wire may be disposed on the surface of the conductive particle, and the other end of the at least one insulating wire may contact the base material or the at least one insulating wire of an adjacent conductive particle structure.

The at least one insulating wire may be attached to the surface of the conductive particle by using a material having a thiol functional group (—SH), a material having an amine functional group (—NH$_2$), or a material having a carboxyl functional group (—COOH).

The at least one insulating wire may have a length that is about 0.5 times to about 20 times greater than a diameter of the conductive particle.

The at least one insulating wire may have a length that is about 1 to about 5 times greater than a diameter of the conductive particle.

The at least one insulating wire may include a material that is the same as a material forming the base material.

The at least one insulating wire may include silicon rubber.

Each of the plurality of conductive particle structures may further include at least one conductive wire extending from the surface of the conductive particle.

The at least one conductive wire may include at least one member selected from a group consisting of a carbon nano-tube, a silver wire, a gold wire, a nickel wire, and a platinum wire.

The at least one conductive wire may include a conductive polymer material, and the conductive polymer material may include at least one material selected from a group consisting of poly(fluorene), polyphenylene, polypyrene, polynaphthalene, polyacetylene, poly(p-phenylene vinylene), poly(pyrrole), polycarbazole, polyindole, polyazepine, polyaniline, poly(thiophene), poly(3,4-ethylenedioxythiophene) (PEDOT), and poly(p-phenylene sulfide).

The at least one conductive wire may be attached to the surface of the conductive particle by using a material having a thiol functional group (—SH), a material having an amine functional group (—NH$_2$), or a material having a carboxyl functional group (—COOH).

The conductive particle may include an insulating core and a conductive coating layer surrounding the insulating core, and the at least one insulating wire extends from a surface of the conductive coating layer.

The base material may include a plurality of through holes, and the plurality of through holes are respectively filled with the plurality of conductive portions.

An upper surface of the base material may be located at a level that is lower than a level of an upper surface of the conductive portion.

According to an aspect of the inventive concept, there is provided a test socket disposed between a semiconductor chip package and a test device to provide an electrical connection between the semiconductor chip package and the test device, wherein the test socket includes: a conductive portion comprising a plurality of conductive particle structures arranged in a first direction and extending in the first direction; and a base material surrounding side surfaces of the conductive portion and having an upper surface at a level that is equal to a level of an upper surface of the conductive portion, wherein each of the conductive particle structures includes a conductive particle and an insulating wire bonded to a surface of the conductive particle by using a bonding material having a functional group.

The bonding material may be a material having a thiol functional group (—SH), a material having an amine functional group (—NH$_2$), or a material having a carboxyl functional group (—COOH).

The base material may contact a surface of an insulating wire and a surface of an associated conductive particle.

Each of the plurality of conductive particle structures may further include a conductive wire bonded to the surface of the conductive particle by a bonding material having a functional group.

The base material may include a plurality of through holes penetrating through the base material in the first direction, the conductive portions may be disposed in the plurality of through holes, and the insulating wire may contact a side wall of each of the plurality of through holes.

According to an aspect of the inventive concept, there is provided a test socket disposed between a semiconductor chip package and a test device to provide an electrical connection between the semiconductor chip package and the test device, wherein the test socket includes: a conductive portion comprising a plurality of conductive particle structures arranged in a first direction and extending in the first direction; and a base material surrounding the conductive portion and having an upper surface located at a level that is equal to a level of an upper surface of the conductive portion, wherein each of the plurality of conductive particle structures includes a conductive particle and a conductive wire bonded to a surface of the conductive particle by a bonding material having a functional group.

The bonding material having the functional group may be a material having a thiol functional group (—SH), a material having an amine functional group (—NH$_2$), or a material having a carboxyl functional group (—COOH).

The base material may contact the surface of a conductive wire and a surface of an associated conductive particle.

According to an aspect of the inventive concept, there is provided a method of manufacturing a test socket, the method including the steps of: forming a conductive particle structure by attaching an insulating wire to a surface of a conductive particle; forming a plurality of conductive portions, each including a plurality of the conductive particle structures arranged in a direction, by applying a magnetic field to a mixture, in which the conductive particle structures and a preliminary base material are mixed, wherein the plurality of conductive portions are spaced apart from each other; and forming a hardened base material surrounding side walls of the plurality of conductive portions by hardening the preliminary base material.

The step of forming the conductive particle structure may include a step of attaching the insulating wire to the surface of the conductive particle by using a material having a thiol functional group (—SH), a material having an amine functional group (—NH$_2$), or a material having a carboxyl functional group (—COOH).

The step of forming the conductive particle structure may also include a step of attaching a conductive wire to the surface of the conductive particle by using a material having a thiol functional group (—SH), a material having an amine functional group (—NH$_2$), or a material having a carboxyl functional group (—COOH).

The step of forming the base material may be performed so that the base material may surround the conductive particle and the insulating wire.

The conductive particle may include magnetic metal, and the base material may include an insulating material having elasticity.

According to an aspect of the inventive concept, there is provided a method of manufacturing a test socket, the method including the steps of: fruiting a conductive particle structure by attaching an insulating wire on a surface of a conductive particle; forming a hardened base material including a plurality of through holes by injecting a preliminary base material into a mold and hardening the preliminary base material; and filling the plurality of through holes with the conductive particle structure so as to form a plurality of conductive portions respectively on side walls of the plurality of through holes.

The conductive particle may include an insulating core and a conductive coating layer surrounding the insulating core.

The step of forming the plurality of conductive portions may include a step of forming the plurality of conductive portions so that the insulating wire on the conductive particle contacts the insulating wire on an adjacent conductive particle or the side wall of each of the plurality of through holes.

In an aspect, embodiments of this invention include a test socket comprising: a base material including an insulating elastic material; and a conductive portion extending through the base material in a thickness direction of the base material, wherein the conductive portion comprises a plurality of conductive particle structures arranged in the thickness direction of the base material, and each of the plurality of conductive particle structures comprises a plurality of conductive particles with at least one insulating wire extending from a surface of the conductive particle.

In some embodiments, an end of the at least one insulating wire of the test socket is disposed on the surface of the conductive particle, and the other end of the at least one insulating wire contacts the base material or the at least one insulating wire of a conductive particle of an adjacent conductive particle structure.

In some embodiments, the at least one insulating wire of the test socket is attached to the surface of the conductive particle by using a material having a thiol functional group (—SH), a material having an amine functional group (—NH$_2$), or a material having a carboxyl functional group (—COOH).

In some embodiments, the at least one insulating wire of the test socket has a length that is about 0.5 times to about 20 times greater than a diameter of the conductive particle.

In some embodiments, the at least one insulating wire of the test socket has a length that is about 1 to about 5 times greater than a diameter of the conductive particle.

In some embodiments, the at least one insulating wire of the test socket comprises a material that is the same as a material forming the base material.

In some embodiments, the at least one insulating wire of the test socket comprises silicon rubber.

In some embodiments, each of the plurality of conductive particle structures of the test socket further comprises conductive particles having at least one conductive wire extending from the surface of the conductive particle.

In some embodiments, the at least one conductive wire of the test socket comprises at least one member selected from a group consisting of a carbon nano-tube, a silver wire, a gold wire, a nickel wire, and a platinum wire.

In some embodiments, the at least one conductive wire of the test socket comprises a conductive polymer material, and the conductive polymer material comprises at least one material selected from a group consisting of poly(fluorene), polyphenylene, polypyrene, polynaphthalene, polyacetylene, poly(p-phenylene vinylene), poly(pyrrole), polycarbazole, polyindole, polyazepine, polyaniline, poly(thiophene), poly(3,4-ethylenedioxythiopherie (PEDOT), and poly(p-phenylene sulfide).

In some embodiments, the at least one conductive wire of the test socket is attached to the surface of the conductive particle by using a material having a thiol functional group (—SH), a material having an amine functional group (—NH$_2$), or a material having a carboxyl functional group (—COOH).

In some embodiments, the conductive particle of the test socket comprises an insulating core and a conductive coating layer surrounding the insulating core, and the at least one insulating wire extends from a surface of the conductive coating layer.

In some embodiments, the base material of the test socket comprises a plurality of through holes, and the plurality of through holes are respectively filled with the plurality of conductive particle structures which comprise the conductive portions.

In some embodiments, an upper surface of the base material of the test socket is located at a level that is lower than a level of an upper surface of the conductive portion.

In another aspect, a test socket to be disposed between a semiconductor chip package and a test device to provide an electrical connection between the semiconductor chip package and the test device comprises: a conductive portion comprising a plurality of conductive particle structures arranged in a first direction and extending in the first direction; and a base material surrounding side surfaces of the conductive portion and having an upper surface at a level that is equal to a level of an upper surface of the conductive portion, wherein each of the conductive particle structures comprises a plurality of conductive particles and an insulating wire bonded to a surface of the conductive particle using a material having a functional group.

In an embodiment, the test socket material having a functional group is a material having a thiol functional group (—SH), a material having an amine functional group (—NH$_2$), or a material having a carboxyl functional group (—COOH).

In an embodiment, the test socket base material contacts a surface of the insulating wire and a surface of the conductive particle.

In an embodiment, each of the plurality of conductive particle structures of the test socket further comprises conductive particles having a conductive wire bonded to the surface of the conductive particle by a material having a functional group.

In an embodiment, the test socket base material comprises a plurality of through holes penetrating through the base material in the first direction, the conductive particle structures comprising the conductive portions are disposed in the plurality of through holes, and the insulating wires contact a side wall of each of the plurality of through holes.

In another aspect, embodiments of this invention include a test socket to be disposed between a semiconductor chip package and a test device to provide an electrical connection between the semiconductor chip package and the test device comprises: a conductive portion comprising a plurality of conductive particle structures arranged in a first direction and extending in the first direction; and a base material surrounding the conductive particle structures comprising the conductive portion and having an upper surface located at a level that is equal to a level of an upper surface of the conductive portion, wherein each of the plurality of conductive particle structures comprises a plurality of conductive particles having a conductive wire bonded to a surface of the conductive particle by a material having a functional group.

In some embodiments, the test socket material having a functional group is a material having a thiol functional group (—SH), a material having an amine functional group (—NH$_2$), or a material having a carboxyl functional group (—COOH).

In some embodiments, the test socket base material contacts the surface of the conductive wire and a surface of the conductive particle.

In still another aspect, embodiments of this invention include a method of manufacturing a test socket wherein the method comprises: forming a conductive particle structure comprising a plurality of conductive particles by attaching an insulating wire to a surface of the conductive particles; forming conductive portions, each comprising a plurality of the conductive particle structures arranged in a direction, by applying a magnetic field to a mixture, in which the conductive particle structures and a preliminary base material are mixed, wherein the plurality of conductive particle structures are spaced apart from each other; and forming a hardened base material surrounding side walls of the plurality of conductive particle structures comprising the conductive portion by hardening the preliminary base material.

In some embodiments, the process of forming the conductive particle structures of the test socket comprises attaching the insulating wire to the surface of a conductive particle using a material having a thiol functional group (—SH), a material having an amine functional group (—NH$_2$), or a material having a carboxyl functional group (—COOH).

In some embodiments, the process of forming the conductive particle structures of the test socket comprises attaching a conductive wire to the surface of a conductive particle using a material having a thiol functional group (—SH), a material having an amine functional group (—NH$_2$), or a material having a carboxyl functional group (—COOH).

In some embodiments, the process of forming the base material of the test socket is performed so that the base material surrounds the conductive particles and the insulating wires.

In some embodiments, the conductive particle of the test socket comprises magnetic metal, and the base material comprises an insulating material having elasticity.

In still another aspect, embodiments of this invention include a method of manufacturing a test socket wherein the method comprises: forming conductive particle structures comprising a plurality of conductive particles by attaching an insulating wire on a surface of the conductive particles; forming a base material comprising a plurality of through holes, by injecting a preliminary base material into a mold having inwardly-projecting protrusion pairs and hardening the preliminary base material; and filling the plurality of through holes with the conductive particle structures so as to form conductive portions extending through the plurality of through holes.

In an embodiment, the conductive particles of the test socket comprise an insulating core and a conductive coating layer surrounding the insulating core.

In an embodiment, the process of forming the plurality of conductive particle structures of the test socket comprises forming the structures so that the insulating wire on the conductive particles contacts an insulating wire on an adjacent conductive particle or the side wall of each of the plurality of through holes.

In still another aspect, embodiments of this invention include a test socket for providing electrical connections between terminals of a semiconductor chip package and corresponding test terminals of a test device when the semiconductor chip package is positioned along a first side of the test socket and the test device is positioned along a second, opposite-facing side of the test socket, the test socket comprising: a base material that includes an elastic insulating material; a plurality of separated conductive particle structures extending through the base material between the first and second sides of the test socket, each conductive particle structure arranged to provide an electrical connection between a terminal of a semiconductor chip package adjacent the first side of the test socket and a terminal of a test device adjacent the second side of the test socket; wherein the conductive particle structures comprise a plurality of conductive particles having a core portion, a coating layer surrounding the core portion, and at least an insulating wire extending from the surface of the conductive particle and bonded at an end to the surface of the conductive particle with a bonding material having a thiol function group (—SH), an amine functional group (—NH$_2$), or a carboxyl function group (—COOH).

In some embodiments, the base material of the test socket contacts a surface of the insulating wire and a surface of the conductive particle.

In some embodiments, each of the plurality of conductive particle structures of the test socket further comprises conductive particles having a conductive wire bonded to the surface of the conductive particle with a bonding material having a functional group.

In some embodiments, the conductive particle of the test socket includes at least one member selected from the group consisting of nickel, cobalt, iron, silver, gold, aluminum, platinum, titanium, palladium and rhodium.

In some embodiments, the conductive particle coating layer of the test socket includes gold and the bonding material includes a thiol functional group (—SH).

BRIEF DESCRIPTION OF THE DRAWINGS

Exemplary embodiments of the inventive concept will be more clearly understood from the following detailed description taken in conjunction with the accompanying drawings in which:

FIG. 10 is a schematic cross-sectional view of a test socket according to another exemplary embodiment of the inventive concept;

DETAILED DESCRIPTION OF THE EMBODIMENTS

Figure 1:
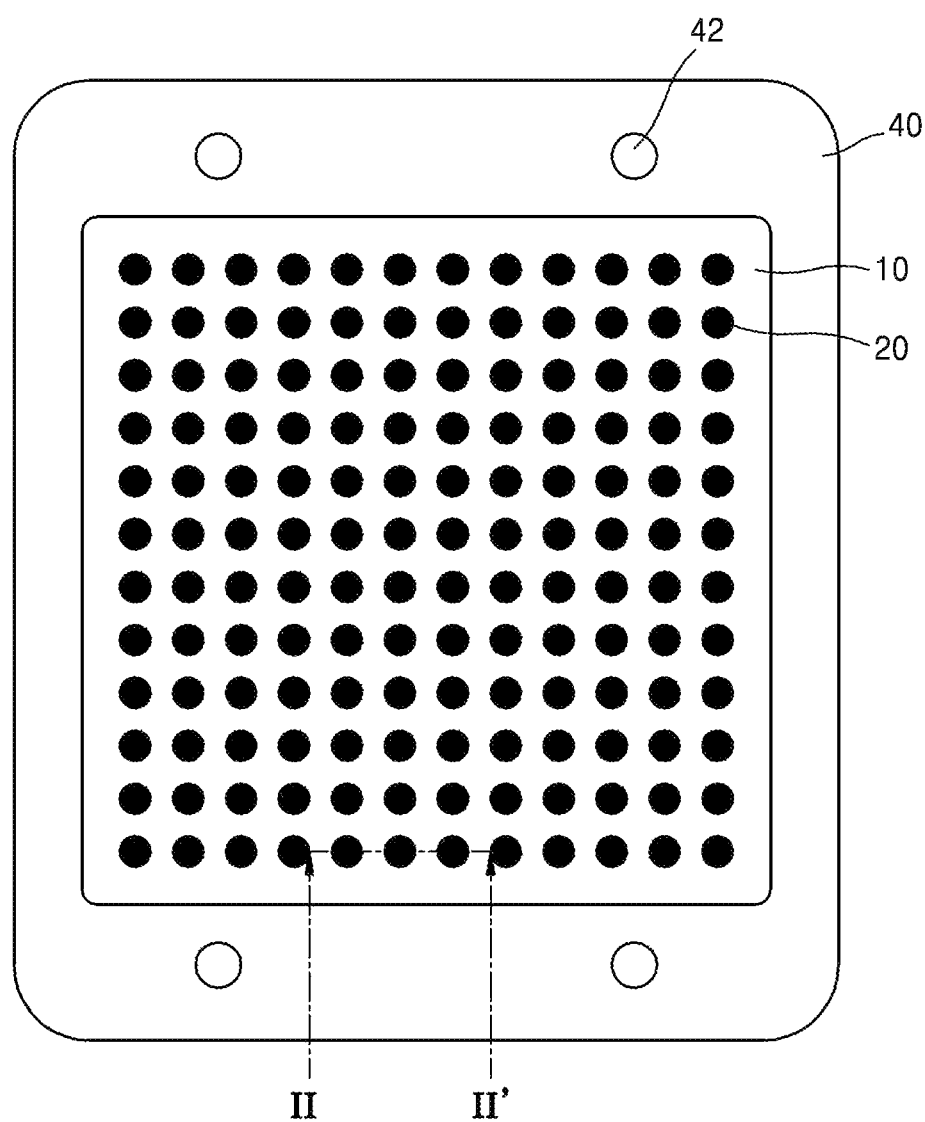
FIG. 1 is a schematic plan view of a test socket according to an exemplary embodiment of the inventive concept.

The inventive concept now will be described more fully hereinafter with reference to the accompanying drawings, in which elements of the invention are shown. The inventive concept may, however, be embodied in many different forms and should not be construed as limited to the exemplary embodiments set forth herein. Rather, these embodiments are provided so that this disclosure will be thorough and complete, and will fully convey the scope of the inventive concept to one of ordinary skill in the art. In the drawings, the thicknesses of layers and regions and the sizes of components may be exaggerated for clarity. Like reference numerals refer to like elements throughout.

It will be understood that when an element, such as a layer, a region, or a substrate, is referred to as being "on," "connected to" or "coupled to" another element, it may be directly on, connected or coupled to the other element, or intervening elements may be present. In contrast, when an element is referred to as being "directly on," "directly connected to" or "directly coupled to" another element or layer, there are no intervening elements or layers present. Other words used to describe the relationship between elements or layers should be interpreted in a like fashion (e.g., "between," versus "directly between," "adjacent," versus "directly adjacent," etc.)

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of exemplary embodiments.

As used herein, the singular forms "a," "an" and "the" are intended to include the plural forms as well, unless the context clearly indicates otherwise. It will be further understood that the terms "comprises" and/or "comprising" used herein specify the presence of stated features, integers, steps, operations, members, components, and/or groups thereof, but do not preclude the presence or addition of one or more other features, integers, steps, operations, members, components, and/or groups thereof. Expressions such as "at least one of," when preceding a list of elements, modify the entire list of elements and do not modify the individual elements of the list.

Unless otherwise defined, all terms (including technical and scientific terms) used herein have the same meaning as commonly understood by one of ordinary skill in the art to which exemplary embodiments belong.

Hereinafter, exemplary embodiments of the present inventive concepts will be described in detail.

FIG. 1 is a plan view of a test socket 100 according to an exemplary embodiment of the inventive concept.

Figure 2:
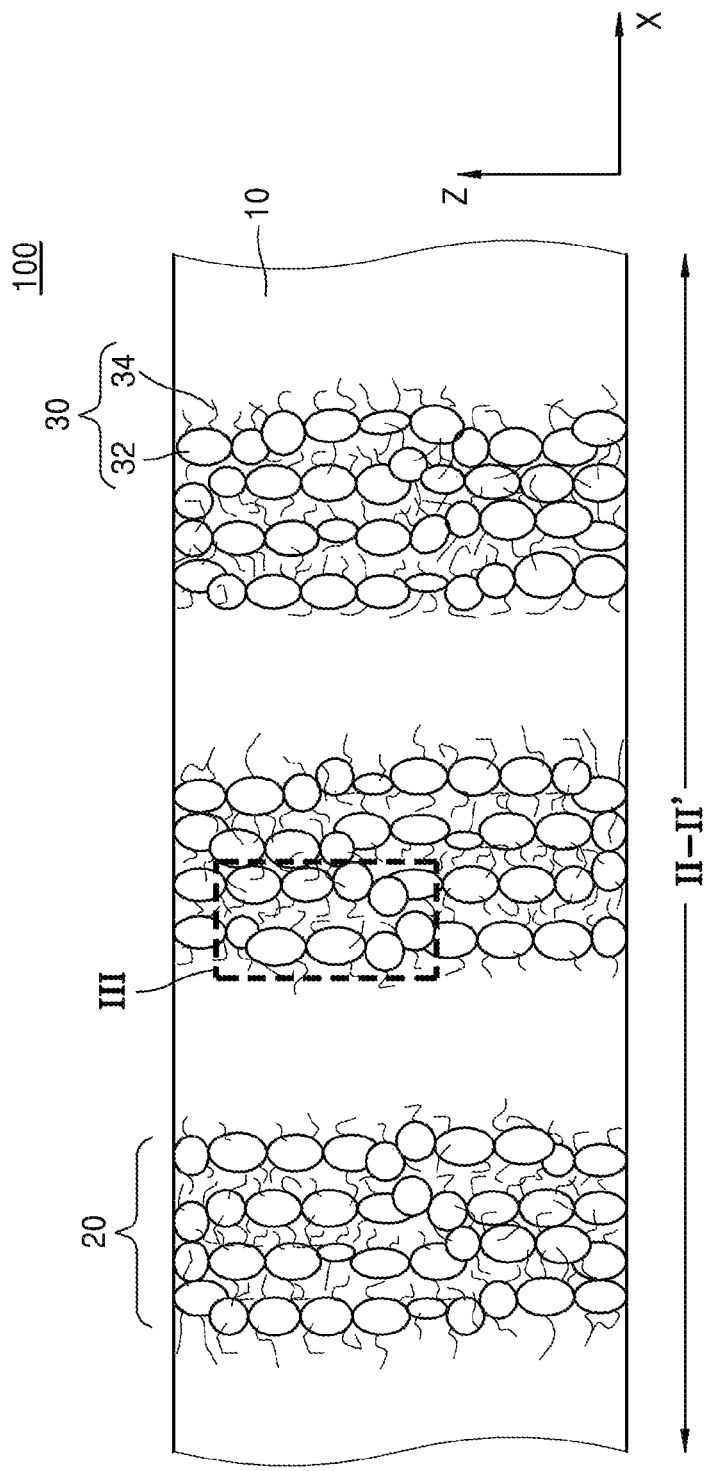
FIG. 2 is a schematic cross-sectional view of a test socket according to an exemplary embodiment of the inventive concept.

FIG. 2 is a cross-sectional view of the test socket 100 according to the present exemplary embodiment, taken along the line II-II' of FIG. 1.

Figure 3:
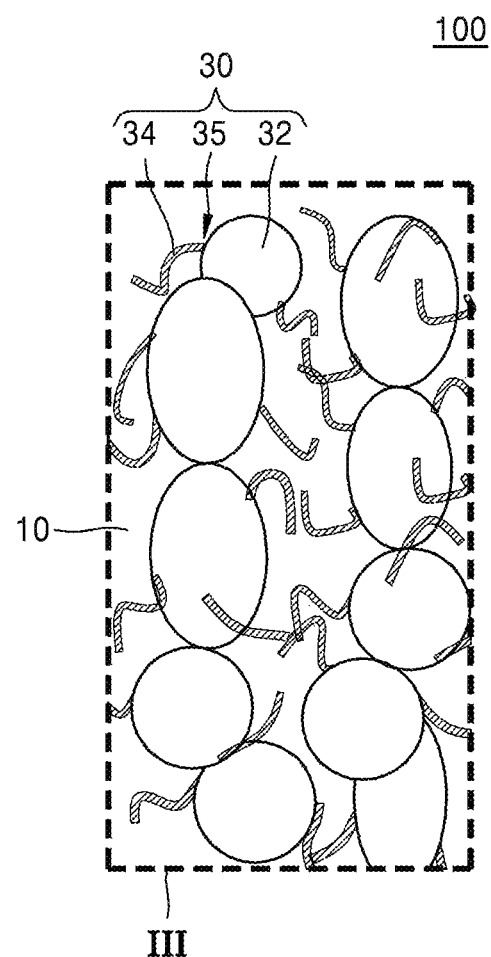
FIG. 3 is an enlarged cross-sectional view of the region identified as III of FIG. 2.

FIG. 3 is an enlarged cross-sectional view of the test socket, in particular, of the region identified as III as shown in FIG. 2.

Referring to FIGS. 1 to 3, the test socket 100 may be a test socket for testing a semiconductor chip package (not shown), and the test socket 100 may provide an electrical connection between the semiconductor chip package and a test device (not shown). The test socket 100 may include a base material 10, a plurality of conductive portions 20, and a frame portion 40. The plurality of conductive portions 20 may be arranged on locations corresponding to terminals of the semiconductor chip package.

The base material 10 may be disposed to surround the plurality of conductive portions 20. In the present exemplary embodiment, the base material 10 may include an elastic insulating material, for example, silicon rubber, butadiene-based rubber, and acrylate-based rubber. However, one or more exemplary embodiments are not limited thereto. Since the base material 10 is elastic, even if a force is applied onto the base material 10 in a thickness direction of the base material 10 to about 10% to 30% of the thickness (for example, a contact pressure is applied so that the thickness of the base material 10 may be reduced by about 10% to about 30%), the base material 10 may restore its original thickness after removing the force. As used in reference to FIG. 1, the term "a thickness direction of the base material 10" will be understood to mean a direction that is generally orthogonal relative to the plane of the surfaces (faces) of test socket 100 depicted in FIG. 1.

The plurality of conductive portions 20 may be arranged on locations corresponding to terminals of the semiconductor chip package, and may extend in the thickness direction of the base material 10. As shown in FIG. 2, the plurality of conductive portions 20 may be surrounded by the base material 10, and upper surfaces of the plurality of conductive portions 20 may be located at the same level as an upper surface of the base material 10.

Each of the plurality of conductive portions 20 may be separated from adjacent conductive portions 20 by a predetermined spacing or separation distance. The predetermined spacing may be substantially equal to a spacing between the terminals in the semiconductor chip package. When the sum of the spacing between the terminals and a width of each terminal is defined as a pitch (or sum of the spacing between adjacent ones of the plurality of conductive portions 20 and a width of each of the plurality of conductive portions 20 is defined as a pitch), each of the plurality of conductive portions 20 may have a pitch that is substantially equal to that of the semiconductor chip package. Therefore, if the pitch of the semiconductor chip package is reduced, the spacing between the plurality of conductive portions 20 may be also correspondingly reduced.

Each of the plurality of conductive portions 20 may include a plurality of conductive particle structures 30 that are arranged in the thickness direction of the base material 10. The plurality of conductive particle structures 30 may be connected to each other to have an electrical conductivity in a Z-axis direction as shown in FIG. 2. In addition, each of the plurality of conductive portions 20 is separated from the other adjacent conductive portions 20 by the base material 10, and, as described above, the base material 10 includes an elastic insulating material. Thus, the test socket 100 may have a conductive anisotropy, that is, have an electrical conductivity only in a direction, for example, along the Z-axis direction of FIG. 2.

Each of the plurality of conductive particle structures 30 may have conductive particles and at least one insulating wire 34 extending from a surface of the conductive particles. In the present exemplary embodiment, the conductive particle 32 may include at least one member selected from a group consisting of nickel, cobalt, iron, silver, gold, aluminum, platinum, titanium, palladium, and rhodium, but is not limited thereto.

In some exemplary embodiments, the conductive particle 32 may have a core particle having magnetism, and a coating layer surrounding the core particle that includes a metal material coated on a surface of the core particle and having high electrical conductivity. For example, the conductive particle 32 may include a core particle including nickel, and a coating layer including gold coated on the surface of the core particle.

The conductive particle 32 may be a structured or unstructured particle. The conductive particle 32 may have a spherical shape, a plate shape, or an oval shape, but is not limited thereto.

According to one or more exemplary embodiments, the conductive particle 32 may have a diameter of about 10 μm to about 100 μm, but is not limited thereto. If the conductive particle 32 has a plate shape, the conductive particle 32 may have a diameter (or a maximum length) that is greater than 100 μm.

The insulating wire or wires 34 may be bonded to the surface of the conductive particle 32 by using an adhesive material 35 (as shown in FIG. 3). An end of the insulating wire 34 may be attached to the surface of the conductive particle 32 by using the adhesive material 35, and the other end of the insulating wire 34 may contact the base material 10. Otherwise, an end of the insulating wire 34 may be attached to the surface of the conductive particle 32 by using the adhesive material 35, and the other end of the insulating wire 34 may contact the insulating wire 34 of other adjacent conductive particles in a particular particle structure 30. Since the insulating wire or wires 34 contacts the base material 10 or the insulating wire or wires 34 of an adjacent conductive particle in the same particle structure 30, a contact area between the conductive particle structure 30 and the base material 10 or between the adjacent conductive particles in particle structure 30 may increase. Therefore, mechanical bonding strength between the conductive particle structure 30 and the base material 10 or between the adjacent conductive particles of a particle structure 30 may increase.

According to one or more exemplary embodiments, the insulating wire 34 may include an insulating material of a one-dimensional structure extending in a direction. For example, the insulating wire 34 may include a rubber material, an inorganic nano-wire, or an inorganic nano-tube.

The insulating wire 34 may include an elastic insulating material such as silicone, vinyl methyl silicone, polysiloxane (organosiloxane), polyacrylate rubber, ethylene-acrylate rubber, polyester urethane, bromo isobutylene isoprene, polybutadiene, chloro isobutylene isoprene, epichlorohydrin, ethylene propylene, ethylene propylene diene monomer (EPDM), polyether urethane, perfluorocarbon rubber, fluoronated hydrocarbon, fluorocarbon rubber, hydrogenated nitrile butadiene rubber (HNBR), polyisoprene, acrylonitrile butadiene, polyurethane, styrene butadiene, styrene ethylene butylene styrene (SEBS) copolymer, acrylonitrile butadiene carboxy monomer, thermoplastic polyether ester elastomer (TPEE), styrene butadiene block copolymer, and styrene butadiene carboxy block copolymer. According to one or more exemplary embodiments, the insulating wire or wires 34 may also include an inorganic wire such as silicon oxide ($SiO_2$) nano-wire or titanium oxide ($TiO_2$) nano-wire, and an inorganic nano-tube such as boron nitride (BN) nano-tube, vanadium oxide ($V_2O_5$) nano-tube, and manganese oxide ($MnO_2$) nano-tube.

According to one or more exemplary embodiments, the insulating wire 34 may include a material that is the same as the base material 10. According to another embodiment, the insulating wire 34 may include a material having physical properties such as hardness, elongation, glass transition temperature, modulus of elasticity, or thermal stability that are similar to those of the base material 10. In such a case, the mechanical bonding strength between the insulating wire 34 and the base material 10 may be improved, and thus, isolation or detachment of the conductive particle structures 30, which may be caused when the test socket 100 is repeatedly used, may be prevented. However, one or more exemplary embodiments of the inventive concept are not limited to the above examples.

The insulating wire 34 may have a length that is about 0.5 to 20 times the diameter of the conductive particle 32. For example, the length of the insulating wire 34 may be one to five times the diameter of the conductive particle 32. If the length of the insulating wire 34 is less than about 0.5 times the diameter of the conductive particle 32, the insulating wires 34 may not easily contact each other, and accordingly, the mechanical bonding strength between the adjacent conductive particles in particle structure 30 may not be improved. If the length of the insulating wire 34 is greater than about 20 times the diameter of the conductive particle 32, the insulating wire 34 may interfere with the close arrangement of the conductive particles 32. In this case, the conductive particles 32 may not easily contact each other, and the conductive portions 20 may not have the desired conductive anisotropy in the Z-axis direction of FIG. 2.

The adhesive material 35 may advantageously include a material having a thiol functional group (—SH), an amine functional group (—$NH_2$), or a carboxyl functional group (—COOH). According to one or more exemplary embodiments, the insulating wire 34 may be attached to the surface of the conductive particle 32 by using an adhesive material having a thiol functional group (—SH). If the conductive particle 32 includes gold, the adhesive material having the thiol functional group (—SH) may be attached to the surface of the gold in a self-assembly manner, as described hereinafter. For example, due to interaction energy between a sulfur (S) atom in the thiol functional group (—SH) and a gold (Au) atom of the conductive particle 32, the S atom and the Au atom may share electrons; and accordingly, the adhesive material having the thiol functional group (—SH) may be used to securely bond a wire 34 to the surface of the conductive particle 32. If the material having the thiol functional group (—SH) is attached to an end of the insulating wire 34, and/or the material having the thiol functional group (—SH) is attached to the surface of the conductive particle 32, the insulating wire 34 may be connected to the conductive particle 32 using the material having the thiol functional group (—SH). Therefore, the insulating wire 34 may be attached to the conductive particle 32 due to a chemical bonding via the material having the thiol functional group (—SH). Such a chemical bonding may have a bonding strength that is greater than that of a physical bonding (or mechanical bonding) between the base material 10 and the conductive particle 32 when the base material 10 surrounds the conductive particle 32.

According to one or more exemplary embodiments, the material having the thiol functional group (—SH) may be a material in which the thiol functional group (—SH) is combined with a hydrocarbon such as an alkane, alkene, or alkyne. However, the material having the thiol functional group (—SH) is not limited to the above examples.

According to one or more exemplary embodiments, the insulating wire 34 may alternatively be attached to the surface of the conductive particle by an amine functional group (—$NH_2$) or a carboxyl functional group (—COOH). In a case where the material having an amine functional group (—$NH_2$) or a carboxyl functional group (—COOH) is attached to an end of the insulating wire 34, and/or the material having the amine functional group (—$NH_2$) or the carboxyl functional group (—COOH) is attached to the surface of the conductive particle 32, the insulating wire 34 may be connected to the conductive particle 32 using the material having the amine functional group (—$NH_2$) or the carboxyl functional group (—COOH).

The frame portion 40 may surround the base material 10 (as shown in FIG. 1). The frame portion 40 may include openings 42 for mounting the test socket 100 to a test device (not shown). The shape of the frame portion 40 is not limited to the example shown in FIG. 1, and the frame portion 40 may have various shapes according to the shape of the semiconductor chip package, or a layout of terminals of the semiconductor chip package, or the structure of the test device to which the test socket 100 is mounted. The test device may include a plurality of test terminals (not shown) that are disposed at locations corresponding to the plurality of conductive portions 20 of the test socket 100, and may include an accommodation device (not shown) by which the semiconductor chip package may be mounted on the test socket 100. The semiconductor chip package may be a ball grid array (BGA) type, but is not limited thereto.

In a case of a general test socket including the metal particles arranged in a direction in an elastic insulating matrix, the metal particles are attached in the insulating matrix through a mechanical bonding or physical bonding process; and, thus, the bonding force between the metal particles and the insulating matrix may be relatively weak. During testing of a semiconductor chip package using the general test socket, in order to reduce a contact resistance between the test socket and the semiconductor chip package and to provide sufficient electrical connection between the test socket and the semiconductor chip package, a force, for example, a contact pressure, may be applied to the insulating matrix in a direction towards the test socket from the semiconductor chip package (for example, along a direction in which the metal particles are arranged or a thickness direction of the insulating matrix). The application of such a force may cause compression of the thickness of the insulating matrix within about a 10 to 30% range of the thickness, and the thickness of the insulating matrix may be correspondingly reduced by about 10 to about 30% due to the application of a force. After finishing the test of the semiconductor chip package, the force is removed, and the insulating matrix may restore itself to its original thickness due to the elasticity of the insulating matrix material. However, if the above test is repeatedly performed, the metal particles arranged in a direction in the insulating matrix may become separated from the insulating matrix due to the weak bonding force between the metal particles and the insulating matrix. The metal particles that have become detached from the insulating matrix may contaminate or damage the terminals of the semiconductor chip package, or the detached metal particles may be connected to other metal particles that have to be separated via the insulating matrix, with the result that the test socket may lose the property of conductive anisotropy. Also, the resistance of the test socket, from which the metal particles are isolated, may increase, or the conductivity in one direction (or the direction in which the metal particles extend) may decrease, and thus, the test socket may no longer properly function as a test socket.

However, according to one or more exemplary embodiments of the inventive concept, an end of the insulating wire 34 may be attached to the surface of the conductive particle 32 by a material having a thiol functional group (—SH), and, thus, the insulating wire 34 may be attached to the conductive particle 32 with relatively higher bonding strength due to the chemical bonding effect as described above. Also, the other end of the insulating wire 34 may contact the base material 10 or other adjacent insulating wire 34. Since the base material 10 contacts the conductive particle 32 and the surface of the insulating wire 34, the contact area between the conductive particle structure 30 and the base material 10 may increase, and, accordingly, the mechanical bonding strength between the conductive particle structure 30 and the base material 10 may also increase. Also, an insulating wire 34 and the other adjacent insulating wires 34 may contact each other to be bonded with each other or to form a network, and, thus, the conductive particle structures 30 may be connected to each other. As a result, separation of the conductive particle structures 30 from the base material 10 may be prevented. Accordingly, the test socket 100 as herein described may prevent contamination or damage on the terminals of the semiconductor chip package caused by the separation of the conductive particle structures 30, and the test socket 100 may thereby have improved durability.

Figure 4:
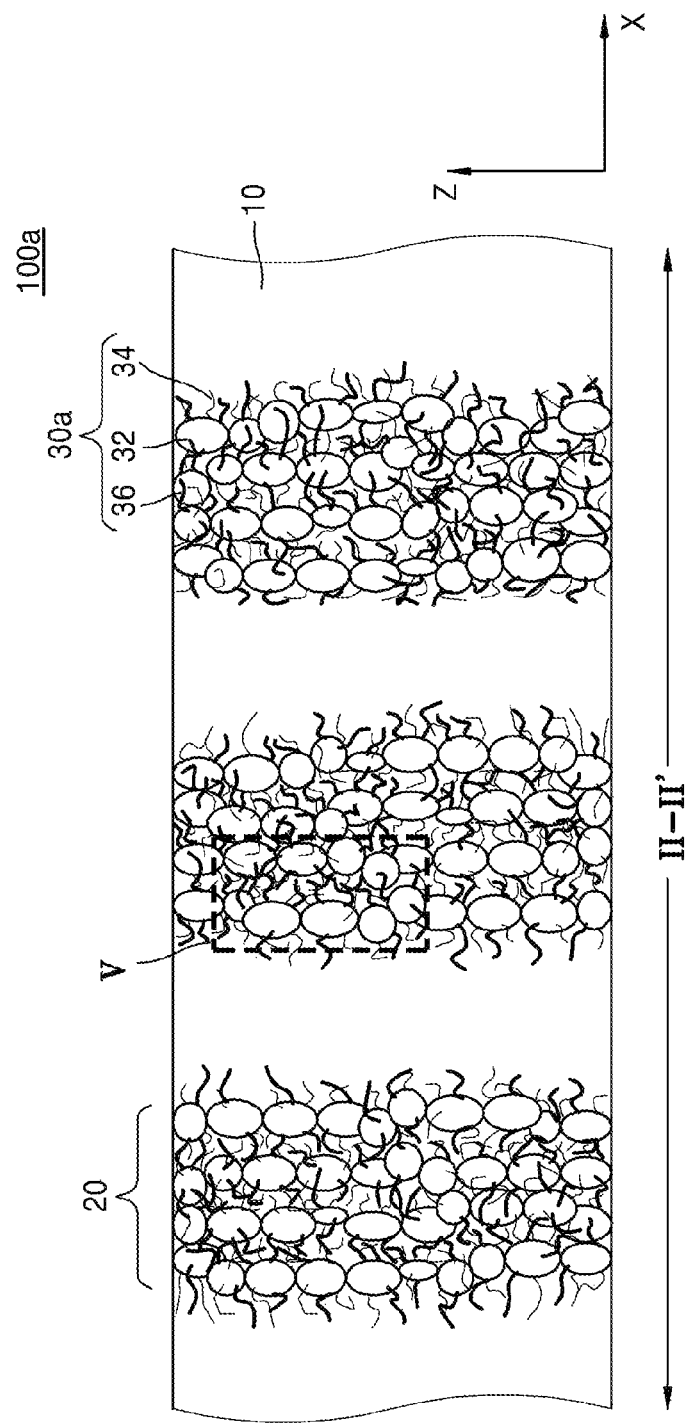
FIG. 4 is a schematic cross-sectional view of a test socket according to another exemplary embodiment of the inventive concept.

FIG. 4 is a cross-sectional view of a test socket 100a according to an exemplary embodiment of the inventive concept.

Figure 5:
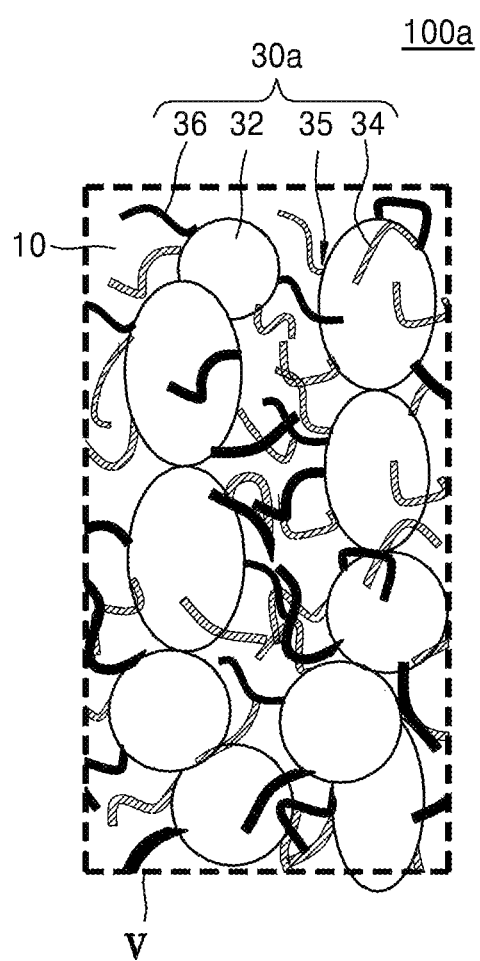
FIG. 5 is an enlarged cross-sectional view of the region identified as V of FIG. 4.

FIG. 5 is an enlarged cross-sectional view of the region identified as V of the test socket 100a as shown in FIG. 4.

The test socket 100a of FIGS. 4 and 5 is similar to the test socket 100 described above with reference to FIGS. 1 to 3, except for a difference in the structure of a conductive particle structure 30a. Thus, differences between the test socket 100a and the test socket 100 will be described below.

Referring to FIGS. 4 and 5, the conductive particle structure 30a includes the conductive particles 32, at least one insulating wire 34, and also at least one conductive wire 36 attached to the surface of each of the conductive particles 32 by using the adhesive material 35 (as seen in FIG. 5).

According to one or more exemplary embodiments, the conductive wire 36 may include a conductive material of a one-dimensional structure extending in a direction. For example, the conductive wire 36 may be a carbon nano-tube, a silver wire, a gold wire, a copper wire, a nickel wire, or a platinum wire. Otherwise, the conductive wire 36 may include a conductive polymer material, for example, poly (fluorene), polyphenylene, polypyrene, polynaphthalene, polyacetylene, poly(p-phenylene vinylene), poly(pyrrole), polycarbazole, polyindole, polyazepine, polyaniline, poly (thiophene), poly(3,4-ethylenedioxythiophene) (PEDOT), or poly(p-phenylene sulfide). However, the conductive polymer material is not limited to the above examples, and the conductive wire 36 may include other conductive polymer materials that may be processed into wires.

According to one or more exemplary embodiments, the conductive wire 36 may have a nano-sized diameter, but is not limited thereto. In addition, the conductive wire 36 may have a length that is about 0.5 to 20 times the diameter of the conductive particle 32, but the length of the conductive wire 36 is not limited thereto.

According to one or more exemplary embodiments, an end of the conductive wire 36 may be attached to the surface of the conductive particle 32 by using a material having a thiol functional group (—SH), an amine functional group (—NH$_2$), or a carboxyl functional group (—COOH). The other end of the conductive wire 36 may contact the base material 10, or the insulating wire 34 or the conductive wire 36 of an adjacent conductive particle in particle structure 30a.

Since the conductive wire 36 includes a material having electrical conductivity, the conductive wire 36 may provide an adjacent conductive particle 32 or an adjacent conductive wire 36, which are in contact with the conductive wire 36, with electrical conductivity. Therefore, resistance of the conductive portions 20 in the test socket 100a may be reduced. Also, since the base material 10 surrounds the conductive particles 32, the insulating wire 34, and the conductive wire 36, a contact area between the base material 10 and the conductive particle structure 30a may increase; and, accordingly, a bonding strength between the base material 10 and the conductive particle structure 30a may be improved. Also, the conductive wire 36 and/or the insulating wire 34 may contact each other or form a network, so as to prevent the isolation or separation of the conductive particle structure 30a from the base material 10 even after repeated uses of the test socket 100a (for example, repeated compression and restoration). Therefore, the test socket 100a may have improved durability.

Figure 6:
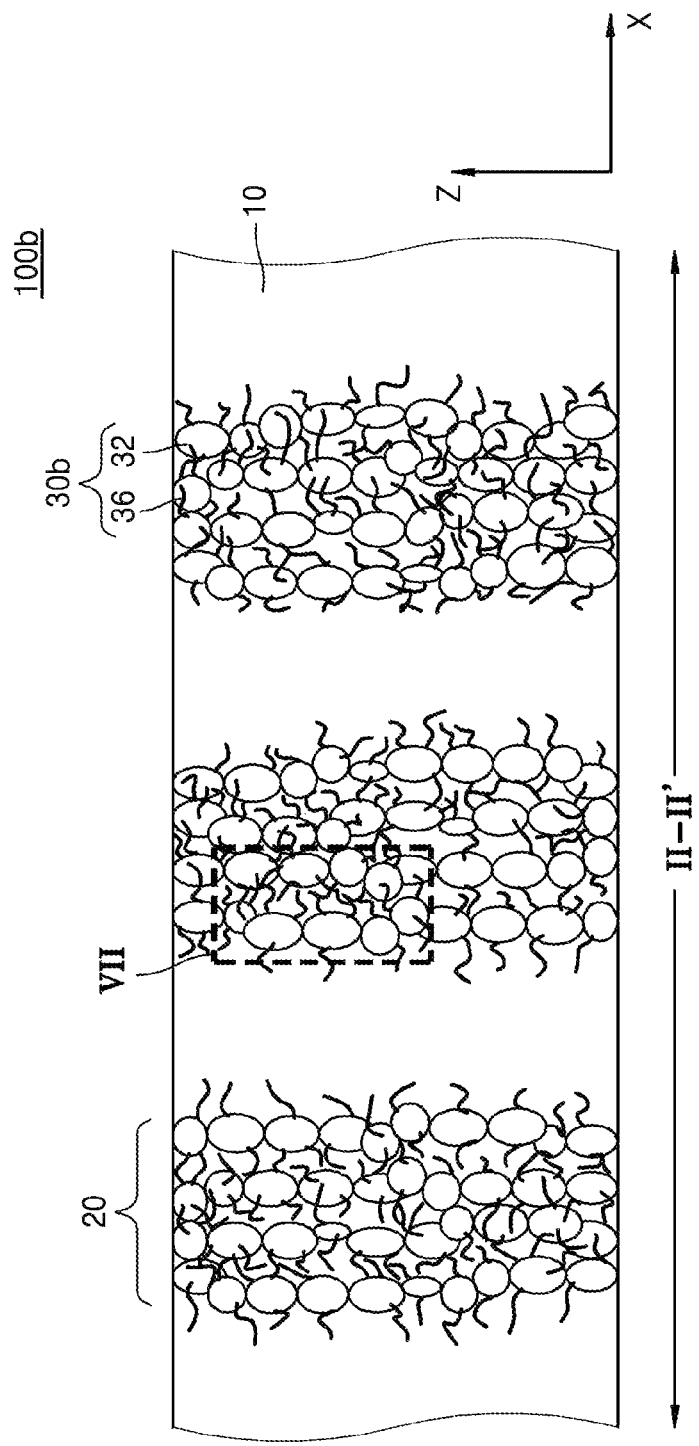
FIG. 6 is a schematic cross-sectional view of a test socket according to another exemplary embodiment of the inventive concept.

FIG. 6 is a cross-sectional view of a test socket 100b according to an exemplary embodiment of the inventive concept.

Figure 7:
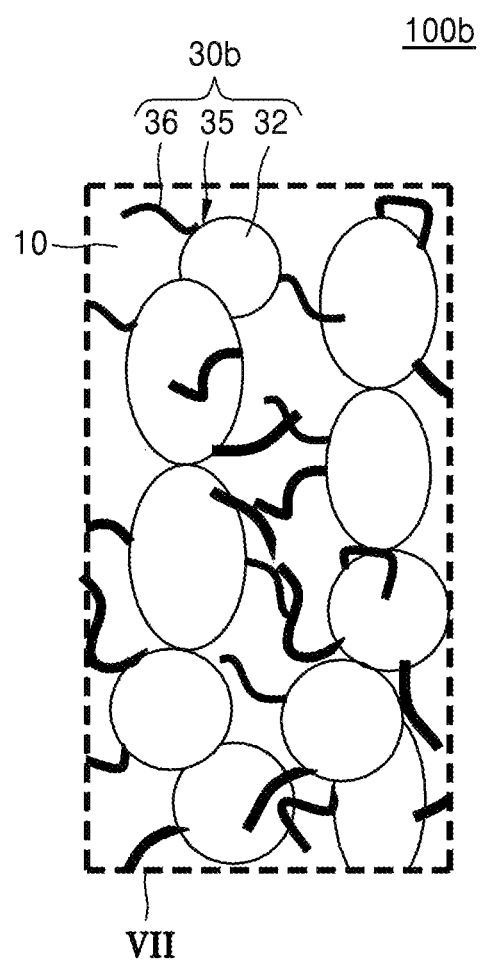
FIG. 7 is an enlarged cross-sectional view of the region identified as VII of FIG. 6.

FIG. 7 is an enlarged cross-sectional view of the test socket 100b according to an exemplary embodiment of the inventive concept. In particular, FIG. 7 shows an enlarged cross-section of the region identified as VII in FIG. 6.

The test socket 100b shown in FIGS. 6 and 7 has a similar structure to that of the test socket 100 described above with reference to FIGS. 1 to 3, except for a difference in the structure of a conductive particle structure 30b. The differences between the test socket 100b and the test socket 100 of the FIGS. 1 to 3 embodiment will be described below.

Referring to FIGS. 6 and 7, the conductive particle structure 30b may include conductive particles 32, and at least one conductive wire 36 attached on a surface of each of the conductive particles 32 via the adhesive material 35 (as seen in FIG. 7).

According to one or more exemplary embodiments, an end of at least one conductive wire 36 may be attached to the surface of the conductive particle 32 by a material having a thiol functional group (—SH), an amine functional group (—NH$_2$), or a carboxyl functional group (—COOH). The other end of the at least one conductive wire 36 may contact the base material 10, or the conductive wire 36 of another adjacent conductive particle in particle structure 30b.

The conductive wire 36 includes a material having electrical conductivity; and, thus, it may provide an adjacent conductive particle 32 or an adjacent conductive wire 36, which is in contact with the conductive wire 36, with electrical conductivity. With this embodiment, when a filling density of the conductive particle structures 30b that fill each of the plurality of conductive portions 20 is reduced, the electrical conductivity of the test socket 100b may be maintained. In accordance with the tendency of reducing the pitch of the semiconductor chip package, it is necessary for the thickness of the test socket to also be reduced. However, when the thickness of the test socket is reduced, the amount of metal particles extending in a direction in the test socket may also be reduced. In such a case, sufficient electrical conductivity may not be provided. Also, intervals (spacings) between the arrays of the metal particles, which have to be separated from each other, are reduced according to the reduction in the pitch, and thus, widths of the arrays of the metal particles also need to be reduced. Again, in this case, sufficient electrical conductivity may not be provided. However, according to the test socket 100b of the present exemplary embodiment, the conductive wires 36 extending from the surface of the conductive particle 32 make electrical connections to the conductive particle 32 or between the conductive wires 36; and, thus, the electrical conductivity in one direction may be increased. Accordingly, the pitch of the test socket 100b may be reduced corresponding to the reduction in the pitch of the semiconductor package. In addition, the test socket 100b may have sufficiently low contact resistance even when the pitch is reduced.

Also, since the base material 10 surrounds the conductive particles 32 and the conductive wire 36, the contact area between the base material 10 and the conductive particle structure 30b may be increased; and, accordingly, a bonding strength between the base material 10 and the conductive particle structure 30b may be increased. Also, the adjacent conductive wires 36 may contact each other or form a network so as to prevent isolation of the conductive particle structure 30b from the base material 10 even after repeated uses of the test socket 100b (for example, repeated compression and restoration). Therefore, the test socket 100b may have improved durability.

Figure 8:
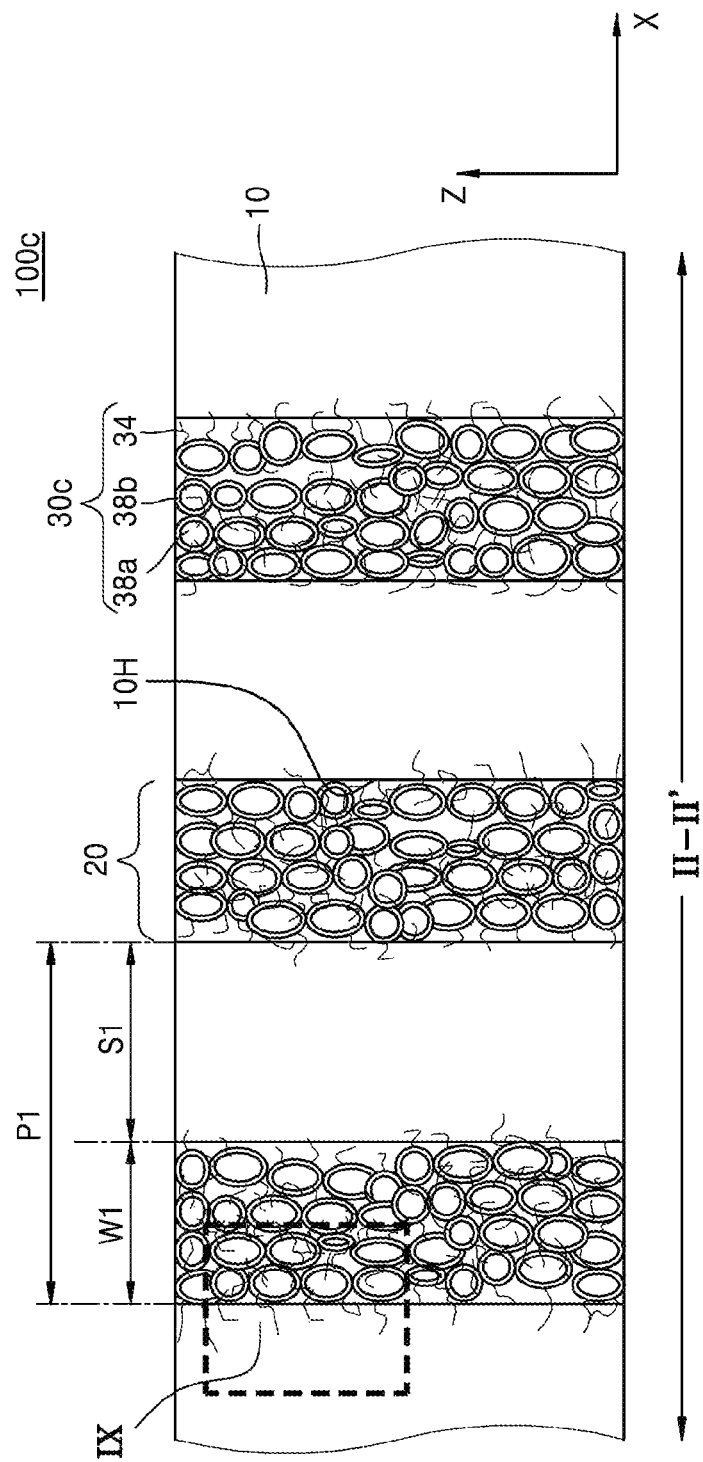
FIG. 8 is a schematic cross-sectional view of a test socket according to another exemplary embodiment of the inventive concept.

FIG. 8 is a cross-sectional view of a test socket 100c according to one or more exemplary embodiments of the inventive concept.

Figure 9:
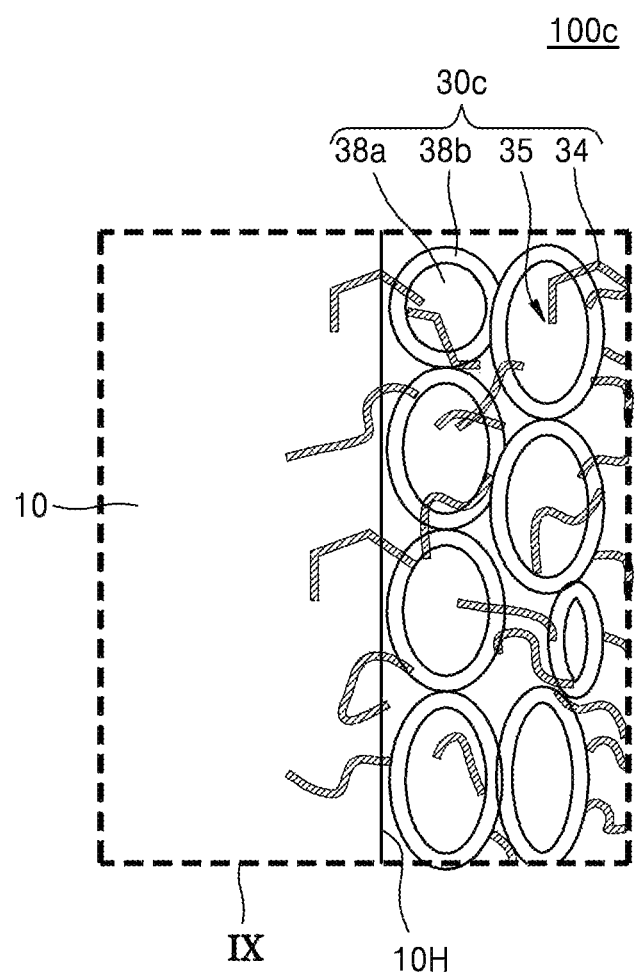
FIG. 9 is an enlarged cross-sectional view of the region identified as IX of FIG. 8.

FIG. 9 is an enlarged cross-sectional view of the test socket 100c. In particular, FIG. 9 shows an enlarged cross-section of the region identified as IX in FIG. 8.

The test socket 100c shown in FIGS. 8 and 9 is similar to the test socket 100 described above with reference to FIGS. 1 to 3, except for a difference in the structure of a conductive particle structure 30c. The differences between the test socket 100c and the test socket 100 of FIGS. 1 to 3 will be described below.

Referring to FIGS. 8 and 9, the base material 10 may include a plurality of through holes 10H. The plurality of through holes 10H may be formed on locations corresponding to terminals of the semiconductor chip package, for example, corresponding to connection terminals such as solder halls.

The plurality of conductive portions 20 may fill in the plurality of through holes 10H. Each of the plurality of conductive portions 20 may have a first width W1 in a length direction of the base material 10, for example, an X-axis direction as seen in FIG. 8, and may be separated from an adjacent conductive portion 20 by a first spacing S1. Here, a pitch P1 of the test socket 100c may be defined as the sum of the first width W1 and the first spacing S1, and the pitch of the semiconductor chip package may be substantially the same as the pitch P1 of the test socket 100c. When the pitch of the semiconductor chip package is reduced, the pitch P1 of the test socket 100c needs to be correspondingly reduced.

As the plurality of conductive portions 20 fill in the plurality of through holes 10H, the first width W1 and the first spacing S1 may be determined according to the width and spacing of the plurality of through holes 10H. According to exemplary processes for manufacturing the test sockets 100, 100a, and 100b described above with reference to FIGS. 1 to 7, when a magnetic field is applied, the plurality of conductive particles 32 are arranged in a row by an N-pole and an S-pole induced therein, and predetermined distances between the conductive particles 32 adjacent in a horizontal direction (for example, the X-axis direction of FIG. 2) may be maintained by the N-pole and the S-pole. Therefore, the width of each of the plurality of conductive portions 20 may be determined by the magnetic field applied to the conductive portions 20. However, according to exemplary processes for manufacturing the test socket 100c described with reference to FIGS. 8 and 9, the plurality of through holes 10H formed in the base material 10 are filled with the conductive particle structures 30c to form the plurality of conductive portions 20. Therefore, the first width W1 of the plurality of conductive portions 20 and the first spacing S1 between the plurality of conductive portions 20 may be determined according to the width and spacing of the plurality of through holes 10H. Thus, the first width W1 of each conductive portion 20 in the horizontal (X-axis) direction and the first spacing S1 between the conductive portions 20 may be adjusted as needed.

In addition, when the pitch of the semiconductor chip package is reduced, the widths and thicknesses of the conductive portions 20 need to be reduced. However, as described above, if the widths and the thicknesses of the conductive portions 20 are reduced, sufficient electrical conductivity may not be provided along the thickness direction of the test socket (for example, the Z-axis direction of FIG. 8). However, when the test socket 100c is manufactured by filling the conductive particle structures 30c in the through holes 10H, the distances between the conductive particle structures 30c may be reduced by a lesser distance than with a test socket where the conductive portions are formed by a magnetic field. Thus, the filling density of the conductive particle structures 30c included in the through holes 10H may increase. As a result, the test socket 100c may have sufficiently low contact resistance to perform effectively even when the pitch of the test socket 100c is reduced to correspond to a reduced pitch of the semiconductor chip package.

According to one or more exemplary embodiments, each of the conductive particles that comprise the conductive particle structures 30c of FIGS. 8 and 9 may include a core 38a, a conductive coating layer 38b surrounding the core 38a, and at least one insulating wire 34 extending from a surface of the conductive coating layer 38b. The core 38a may include an insulating material such as a glass bead or a polymer particle. The conductive coating layer 38b may include metal such as gold, silver, palladium, rhodium, platinum, titanium, or nickel.

In one or more exemplary embodiments, the at least one insulating wire 34 may be attached to a surface of the conductive coating layer 38b by a material having a thiol functional group (—SH), an amine functional group (—NH$_2$), or a carboxyl functional group (—COOH). For example, the material having a thiol functional group (—SH) is attached on the surface of the conductive coating layer 38b that includes gold, and then the insulating wire 34 that includes silicon rubber is attached to an end of the material having the thiol functional group (—SH). Thus, the insulating wire 34 may extend from the surface of the conductive coating layer 38b.

As described above, the core 38a may include an insulating material such as a glass bead or a polymer particle. Since the test socket 100c may be manufactured by filling the conductive particle structures 30c in the through holes 10H, the conductive particle structure 30c may not include a core particle having a magnetic material, which is different from a case where the conductive portions 20 are formed by using a magnetic field (as earlier described).

FIG. 10 is a cross-sectional view of a test socket 100d according to another exemplary embodiment of the inventive concept.

The test socket 100d of FIG. 10 is similar to the test socket 100 described above with reference to FIGS. 1 to 3, except for a difference in the height of a conductive portion 20a. The differences between the test socket 100d and the test socket 100 of FIGS. 1 to 3 will be described below.

Referring to FIG. 10, a plurality of conductive portions 20a may extend above the base material 10 so that upper surfaces of the plurality of conductive portions 20a may be located at a level LV1 that is higher than a level LV0 of the upper surface of the base material 10. For example, the height of the plurality of conductive portions 20a in the thickness direction (Z-axis direction in FIG. 10) of the base material 10 may be greater than the thickness of the base material 10 in the Z-axis direction. If the terminals of the semiconductor chip package do not protrude from a lower surface of the semiconductor chip package, or if those terminals are somewhat recessed in the surface of the semiconductor chip package, because the upper surfaces of the plurality of conductive portions 20a are located higher than the upper surface of the base material 10 in this FIG. 10 embodiment, the electrical connection between the plurality of conductive portions 20a and the terminals of the semiconductor chip package may still be completed.

The insulating wire 34 of the conductive particle structure 30 in FIG. 10 may contact an adjacent insulating wire 34, and accordingly, the conductive particles 32 may be strongly attached into the plurality of conductive portions 20a by the insulating wires 34. Therefore, the test socket 100d may have improved durability and excellent conductivity.

FIGS. 11A to 11E are cross-sectional views illustrating a method of manufacturing a test socket according to an exemplary embodiment of the inventive concept. The method according to the present exemplary embodiment may be a method for manufacturing the test sockets 100, 100a, and 100b described above with reference to FIGS. 1 to 7.

Figure 11A:
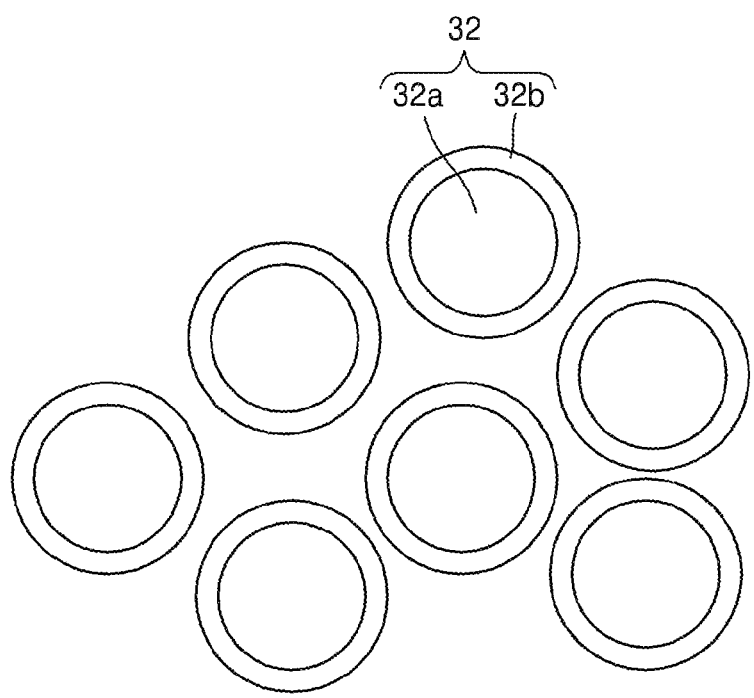
FIGS. 11A to 11E are schematic cross-sectional views that illustrate a method of manufacturing a test socket, according to an exemplary embodiment of the inventive concept.

Referring to FIG. 11A, the conductive particles 32, each including a core 32a and a conductive coating layer 32b surrounding the core 32a, may be prepared. According to the present exemplary embodiment, the core 32a may be metal powder including nickel, cobalt, or iron having magnetic properties. The conductive coating layer 32b may be a metal material having high conductivity, for example, gold, silver, platinum, palladium, and rhodium. The conductive coating layer 32b surrounding the core 32a may be formed by, for example, an electroplating method or an electroless plating method.

According to one or more exemplary embodiments, the core 32a may have a diameter of about 10 μm to about 100 μm, but is not limited thereto. Also, the conductive coating layer 32b may have a thickness of about 10 nm to about 5 μm, but is not limited thereto. That is, the thickness of the conductive coating layer 32b may vary depending on the material forming the conductive coating layer 32b, the pitch and thickness of the test socket 100, 100a or 100b, and a degree of electrical conductivity required by the test socket.

Figure 11B:
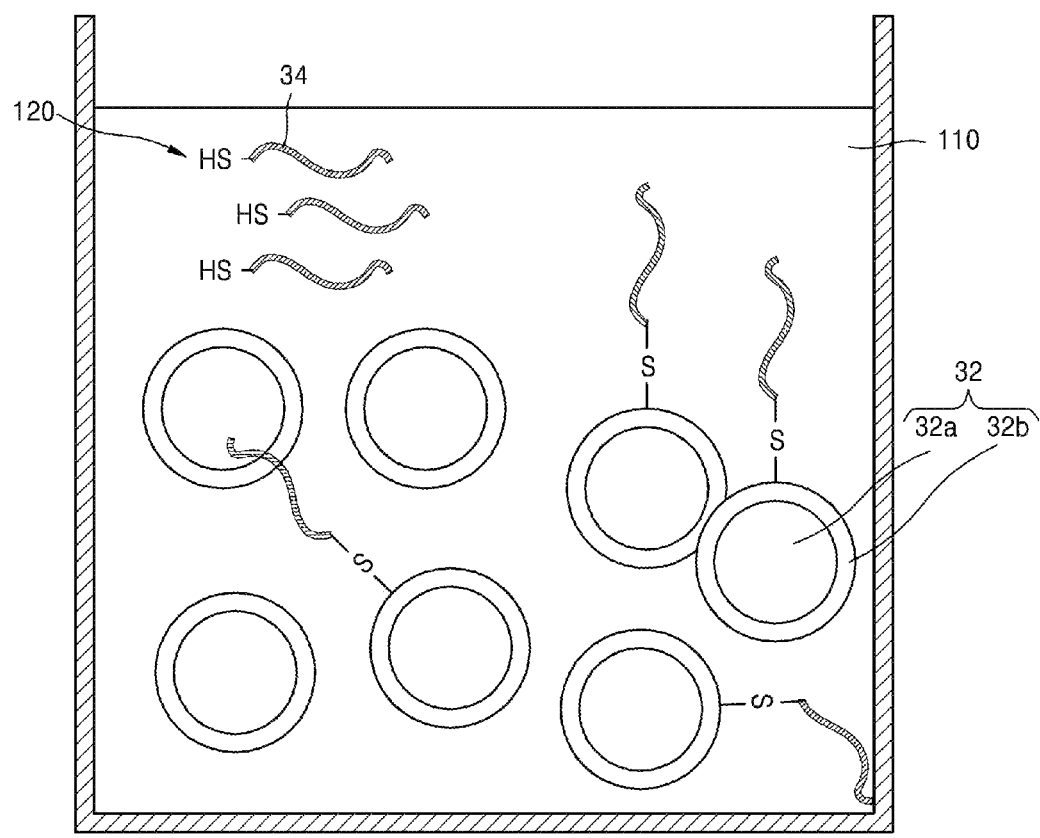

Referring to FIG. 11B, a solution 110 including an insulating wire assembly 120 comprising a plurality of insulating wires 34 to which the material having a thiol functional group (—SH) is bonded may be prepared. In one or more exemplary embodiments, the conductive particles 32 are immersed in the solution 110 including the insulating wire assembly 120 so that the insulating wires 34 having the thiol functional group (—SH) may be bonded to the surfaces of the conductive particles 32 in a self-assembly manner. For example, if the conductive coating layer 32b on the surface of the conductive particle 32 contains gold, a sulfur (S) element of the thiol functional group (—SH) and a gold (Au) element of the conductive coating layer 32b may share electrons due to interacted energy therebetween; and, accordingly, the insulating wires 34 having the thiol functional group (—SH) may be attached to the surface of the conductive coating layer 32b. The solution 110 may include, for example, a solvent such as N-methyl-2-pyrrolidone (NMP), but is not limited thereto.

Although not shown in FIG. 11B, carbon, alkane, or alkene may be further formed between the thiol functional group (—SH) and the insulating wire 34.

In addition, although not shown in the drawings, an insulating wire assembly (not shown) comprising a plurality of insulating wires 34 to which a material having an amine functional group (—NH$_2$) or a material having a carboxyl functional group (—COOH), instead of the material having a thiol functional group (—SH), may be provided.

Also, after attaching the insulating wires 34 to the surfaces of the conductive particles 32, conductive wires 36 (see FIG. 4) may also be attached to the surfaces of the conductive particles 32 by using a material having a thiol functional group (—SH), an amine functional group (—NH$_2$), or a carboxyl functional group (—COOH). In this way, the test socket 100a described with reference to FIGS. 4 and 5 may be manufactured.

Otherwise, instead of performing the process of attaching the insulating wires 34 to the surfaces of the conductive particles 32, the conductive wires 36 (see FIG. 6) may be attached to the surfaces of the conductive particles by using a material having a thiol functional group (—SH), an amine functional group (—NH$_2$), or a carboxyl functional group (—COOH) so as to manufacture the test socket 100b described with reference to FIGS. 6 and 7.

Figure 11C:
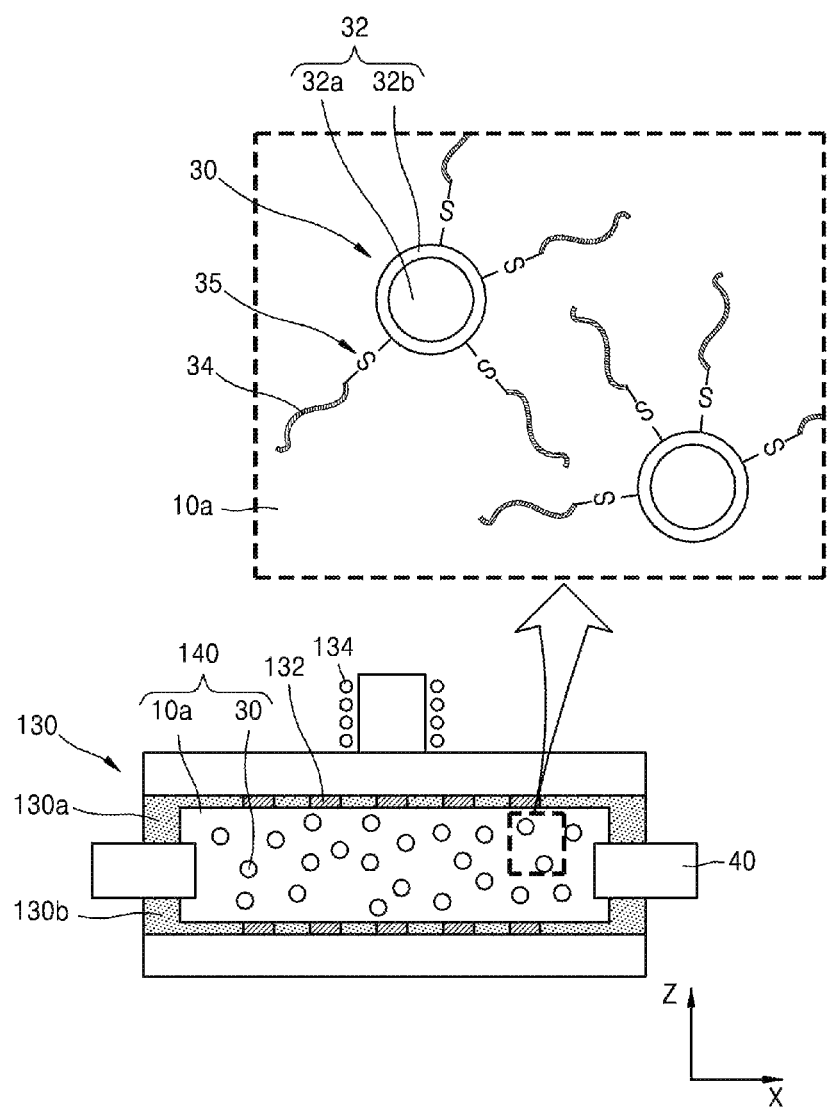

Referring to FIG. 11C, the solution 110 is removed to form the conductive particle structure 30, in which the insulating wires 34 are bonded to the surfaces of the conductive particles 32 by the thiol functional group (—SH). The conductive particle structure 30 may include the conductive particle 32, and at least one insulating wire 34 attached to the surface of the conductive particle 32 via the sulfur (S)-containing adhesive material 35.

Next, a mixture 140 is prepared as a mixture of the conductive particle structure 30 and a preliminary base material 10a. The mixture 140 may be injected into a mold 130, in which a forming space is defined. The mold 130 may include an upper mold 130a and a lower mold 130b, and the upper and lower molds 130a and 130b may respectively include a plurality of generally aligned magnetic pads 132 (illustrated by the cross-hatched regions in FIGS. 11C and 11D). The plurality of magnetic pads 132 may be formed at locations corresponding to a plurality of conductive portions (for example, corresponding to conductive portions 20 of FIG. 11D). A coil 134 may be connected to a part of the mold 130 so as to apply a magnetic field to the plurality of magnetic pads 132 in the mold 130.

The preliminary base material 10a may be a liquid-phase material of a polymer material having a cross-linking structure. For example, the preliminary base material 10a may be hardened to form the base material 10 described previously with reference to FIGS. 1 to 3.

Figure 11D:
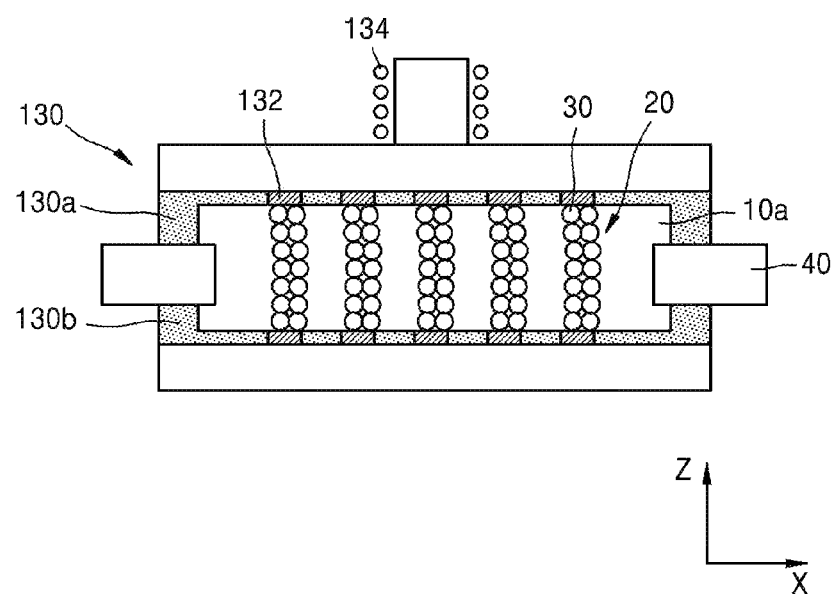

Referring to FIG. 11D, the magnetic field is applied to the plurality of magnetic pads 132 of the upper and lower molds 130a and 130b, respectively, to form the plurality of conductive portions 20. Here, the conductive particle structures 30 may extend in a direction between the upper and lower molds due to the magnetic field in each of the plurality of conductive portions 20. In particular, the cores 32a (see FIG. 11C) of the conductive particle structures 30 are polarized as N-poles and S-poles between the magnetic pads 132 of the upper mold 130a and the corresponding magnetic pads 132 of the lower mold 130b, and then, may be arranged in a row. Accordingly, the plurality of conductive portions 20 extending in a direction are formed at the locations corresponding to aligned pairs of magnetic pads 132, and the preliminary base material 10a may surround the plurality of conductive portions 20. The plurality of conductive portions 20 extend in a thickness direction of the mold 130 so as to connect the magnetic pads 132 of the upper mold 130a and the corresponding magnetic pads 132 of the lower mold 130b to each other, and the conductive portions 20 may not connect to other adjacent conductive portions 20.

When the conductive particle structures 30 are arranged in a row, the insulating wires 34 disposed on the surfaces of the conductive coating layers 32b of the conductive particles 32 of one conductive particle structure 30 may contact the insulating wires 34 of conductive particles 32 of other adjacent conductive particle structures 30, or may contact the preliminary base material 10*a*.

Figure 11E:
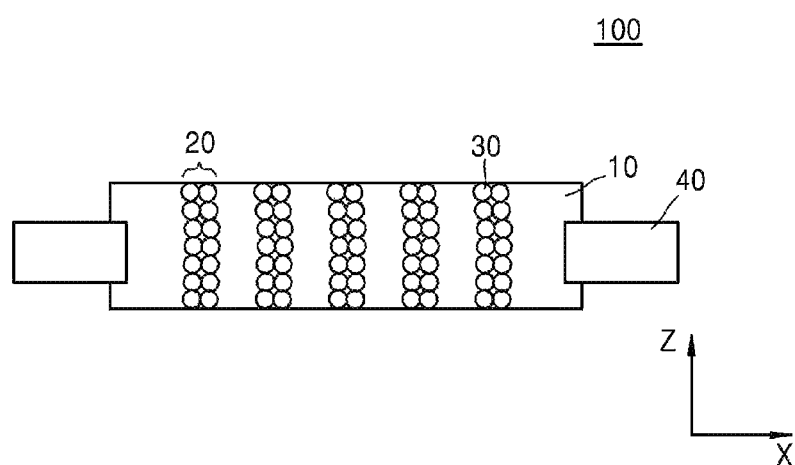

Referring to FIG. 11E, the preliminary base material (10*a* of FIG. 11D) may be hardened so as to form the hardened base material 10 surrounding the plurality of conductive portions 20 in the mold 130.

While the preliminary base material 10*a* is becoming hardened, the insulating wires 34 of the conductive particle structures 30 may be disposed in the base material 10 in contact with the preliminary base material 10*a*. Therefore, the contact area between the insulating wires 34 and the hardened base material 10 may increase, and accordingly, the bonding strength may increase due to the contact between the plurality of conductive portions 20 and the hardened base material 10. Also, in a case where the insulating wires 34 and the hardened base material 10 include the same material or materials having similar physical properties to each other (for example, the insulating wires 34 may include silicon resin and the hardened base material 10 may also include silicon resin), the mechanical bonding strength between the insulating wires 34 and the hardened base material 10 may be increased.

The upper surfaces of the plurality of conductive portions 20 may be located at the same level as that of the upper surface of the base material 10, and the plurality of conductive portions 20 may provide the electrical conductivity along the thickness direction of the hardened base material 10. Since the hardened base material 10 includes an insulating material, the hardened base material 10 may electrically insulate each of the conductive portions 20 from the other adjacent conductive portions 20. Therefore, electrical conductivity is provided only along one direction, that is, the thickness direction of the base material 10, while the electrical insulating property is provided in another direction, that is, along the length direction of the base material 10. This results in the property of conductive anisotropy for the test socket.

According to the above processes, the test socket 100 of FIGS. 1 to 3 may be manufactured.

Figure 12A:
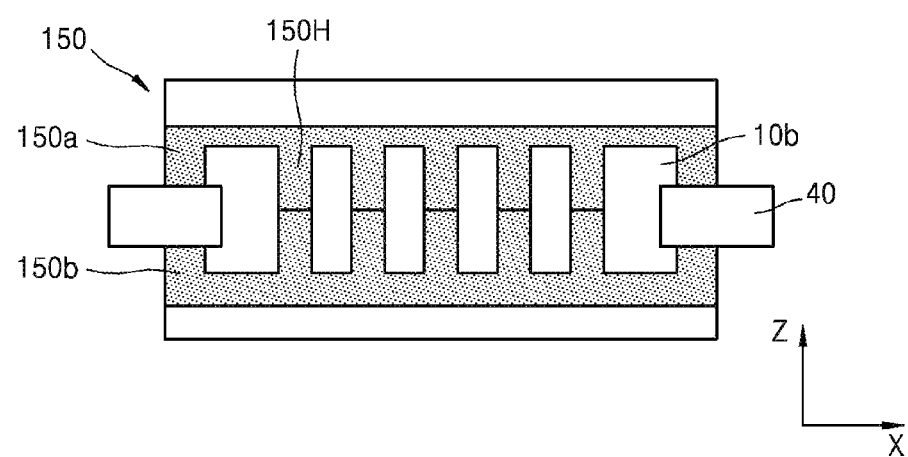
FIGS. 12A to 12C are schematic cross-sectional views that illustrate a method of manufacturing a test socket, according to another exemplary embodiment of the inventive concept.
Figure 12B:
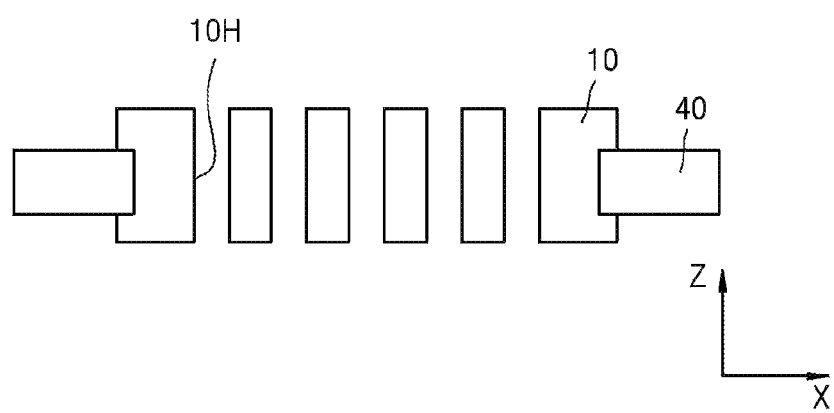
Figure 12C:
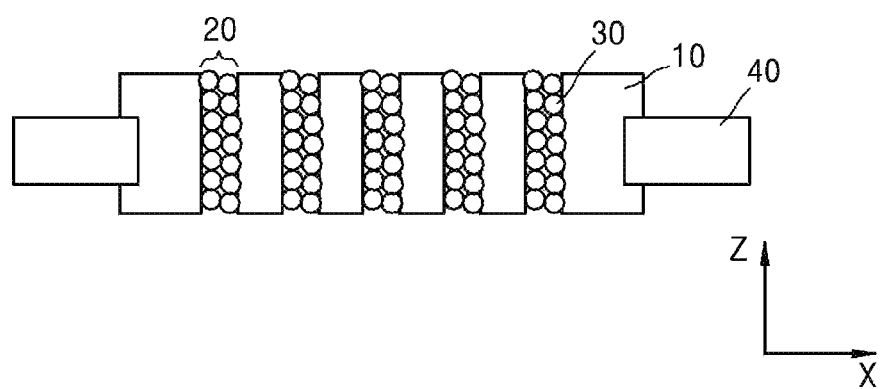

FIGS. 12A to 12C are cross-sectional views of a method of manufacturing the test socket according to one or more other exemplary embodiments of the inventive concept, for example a method of manufacturing the test socket 100*c* described with reference to FIGS. 8 and 9.

First, the processes described above with reference to FIGS. 11A and 11B are performed to form the conductive particle structures 30 as shown in FIG. 11C. In addition, the conductive particle structures 30 may include conductive particles having an insulating core 38*a* (see FIG. 8), a conductive coating layer 38*b* (see FIG. 8) surrounding the insulating core 38*a*, and insulating wires 34 (see FIG. 8), as described above with reference to FIGS. 8 and 9.

Referring now to FIG. 12A, the preliminary base material 10*b* may be injected into a mold 150, in which a forming space is defined.

The mold 150 may include an upper mold 150*a* and a lower mold 150*b*, and aligned pairs of protrusions 150H disposed at locations where the plurality of through holes 10H (see FIG. 12B) will be formed. According to one or more exemplary embodiments, side walls of the protrusions 150H of the upper mold 150*a* and side walls of the protrusions 150H of the lower mold 150*b* may be arranged to align with each other.

In FIG. 12A, the protrusions 150H are shown extending in a vertical direction (for example, a Z-axis direction of FIG. 12A), but the protrusions 150H may alternatively be inclined at a predetermined angle with respect to the vertical direction. For example, if a width of an uppermost portion of the protrusion 150H of the upper mold 150*a* is less than a width of a bottom portion of the protrusion 150H of the upper mold 150*a* (otherwise, if a width of an uppermost portion of the protrusion 150H of the lower mold 150*b* is less than a width of a bottom portion of the protrusion 150H of the lower mold 150*b*), a width of an uppermost portion of the through hole 10H may be less than a width of an intermediate portion of the through hole 10H. In this case, a width at an uppermost portion of the conductive portion 20 (see FIG. 12C) filled in the through hole 10H in a post process step may be less than a width at an intermediate portion of the conductive portion 20. In this way, the electrical conductivity of the test socket 100*c* is increased, and at the same time, the spacing between the uppermost portions of the conductive portions 20 connected to the semiconductor chip package may be increased. As a result, isolation of the conductive particle structures 30 may be prevented, and unnecessary electrical connection between the adjacent conductive portions 20 may be prevented.

Referring to FIG. 12B, a preliminary base material 10*b* (see FIG. 12A) is hardened so as to form a hardened base material 10 including the plurality of through holes 10H.

The plurality of through holes 10H may penetrate through the hardened base material 10 in the thickness direction (for example, the Z-axis direction of FIG. 12B), and may be disposed at locations corresponding to the terminals of the semiconductor chip package. Also, as described above, the shapes of the plurality of through holes 10H may vary depending on the shapes of the plurality of protrusions 150H used to define the through holes (see FIG. 12A).

Referring to FIG. 12C, the conductive particle structures 30 may be respectively filled in the plurality of through holes 10H (see FIG. 12B).

According to one or more exemplary embodiments, the conductive particle structures 30 (formed by the processes of FIGS. 11A and 11B) are mixed with an organic solvent or an adhesive sealant to form a mixture, and the mixture may be filled in the plurality of through holes 10H. After that, the base material 10, in which the mixture is filled, is dried or thermally treated so as to evaporate the organic solvent or the adhesive sealant; and, then, the plurality of conductive portions 20, comprising the conductive particle structures 30, may be formed.

During the processes of forming the conductive portions 20, the mixture covering the upper surface of the base material 10 may be polished so that the upper surfaces of the plurality of conductive portions 20 may be located at substantially the same level as the upper surface of the base material 10. Since the plurality of conductive portions 20 are not electrically connected to the other adjacent conductive portions 20, the test socket 100*c* may have the property of conductive anisotropy.

While the inventive concept has been particularly shown and described with reference to exemplary embodiments thereof, it will be understood that various changes in form and details may be made therein without departing from the spirit and scope of the following claims.

What is claimed is:

1. A test socket comprising:
    a plurality of separate conductive portions, each extending completely through a base material in a thickness direction of the base material between opposite-facing surfaces of the base material,
    wherein each conductive portion comprises a conductive particle structure arranged in the thickness direction of the base material comprising a plurality of conductive particles each with an exterior surface bonded to a first end of at least one insulating wire extending outward from the surface of the associated conductive particle.

2. The test socket of claim 1, wherein the first end of the at least one insulating wire is disposed on the surface of the associated conductive particle, and the other end of the at least one insulating wire contacts the base material or the at least one insulating wire of an adjacent conductive particle.

3. The test socket of claim 1, wherein the at least one insulating wire is bonded to the surface of the associated conductive particle by using a material having a thiol functional group (—SH), a material having an amine functional group (—NH$_2$), or a material having a carboxyl functional group (—COOH).

4. The test socket of claim 1, wherein the at least one insulating wire has a length that is about 0.5 times to about 20 times greater than a diameter of the associated conductive particle.

5. The test socket of claim 1, wherein the at least one insulating wire has a length that is about 1 to about 5 times greater than a diameter of the associated conductive particle.

6. The test socket of claim 1, wherein the at least one insulating wire comprises a material that is the same as a material forming the base material.

7. The test socket of claim 1, wherein the at least one insulating wire comprises silicon rubber.

8. The test socket of claim 1, wherein each conductive particle structure further comprises conductive particles having at least one conductive wire, that is different than the insulating wire, bonded at one end to, and extending from, the surface of the associated conductive particle.

9. The test socket of claim 8, wherein the at least one conductive wire comprises at least one member selected from a group consisting of a carbon nano-tube, a silver wire, a gold wire, a nickel wire, and a platinum wire.

10. The test socket of claim 8, wherein the at least one conductive wire comprises a conductive polymer material, and the conductive polymer material comprises at least one material selected from a group consisting of poly(fluorene), polyphenylene, polypyrene, polynaphthalene, polyacetylene, poly(p-phenylene vinylene), poly(pyrrole), polycarbazole, polyindole, polyazepine, polyaniline, poly(thiophene), poly(3,4-ethylenedioxythiophene) (PEDOT), and poly(p-phenylene sulfide).

11. The test socket of claim 8, wherein the one end of the at least one conductive wire is attached to the surface of the conductive particle using a material having a thiol functional group (—SH), a material having an amine functional group (—NH$_2$), or a material having a carboxyl functional group (—COOH).

12. The test socket of claim 1, wherein the conductive particle comprises an insulating particle core and a conductive coating layer completely surrounding the insulating particle core, and also wherein the at least one insulating wire extends outward from the conductive coating layer.

13. The test socket of claim 1, wherein the base material comprises a plurality of through holes, and the through holes are respectively filled with the conductive particles to form the plurality of conductive portions.

14. The test socket of claim 1, wherein an upper surface of the each conductive portion projects above at least one of the opposite-facing surfaces of base material.

15. A test socket for providing electrical connections between terminals of a semiconductor chip package and corresponding test terminals of a test device when the semiconductor chip package is positioned along a first side of the test socket and the test device is positioned along a second, opposite-facing side of the test socket, the test socket comprising:
a base material that includes an elastic insulating material;
a plurality of separated conductive particle structures extending through the base material between the first and second sides of the test socket, each conductive particle structure arranged to provide an electrical connection between a terminal of a semiconductor chip package adjacent the first side of the test socket and a terminal of a test device adjacent the second side of the test socket;
wherein the conductive particle structures comprise a plurality of conductive particles each having a particle core portion, a coating layer completely surrounding the particle core portion to form a particle surface, and at least an insulating wire extending outward from the particle surface and bonded at an insulating wire end to the particle surface with a bonding material having a thiol function group (—SH), an amine functional group (—NH$_2$), or a carboxyl function group (—COOH).

16. The test socket of claim 15, wherein the base material contacts a surface of the insulating wire and the surface of the conductive particle.

17. The test socket of claim 15, wherein each of the conductive particles also has a conductive wire bonded at a conductive wire end to the surface with a bonding material having a functional group.

18. The test socket of claim 15, wherein the conductive particle includes at least one member selected from the group consisting of nickel, cobalt, iron, silver, gold, aluminum, platinum, titanium, palladium and rhodium.

19. The test socket of claim 15, wherein the conductive particle coating layer includes gold and the bonding material includes a thiol functional group (—SH).

* * * * *